(12) United States Patent
Ayyapureddi

(10) Patent No.: US 12,260,896 B2
(45) Date of Patent: Mar. 25, 2025

(54) APPARATUS WITH MEMORY PROCESS FEEDBACK

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 252 days.

(21) Appl. No.: 17/965,706

(22) Filed: Oct. 13, 2022

(65) Prior Publication Data

US 2023/0206988 A1    Jun. 29, 2023

Related U.S. Application Data

(60) Provisional application No. 63/293,716, filed on Dec. 24, 2021.

(51) Int. Cl.

| | | |
|---|---|---|
| G11C 11/4078 | (2006.01) | |
| G11C 5/00 | (2006.01) | |
| G11C 11/4096 | (2006.01) | |
| G11C 29/52 | (2006.01) | |
| G11C 7/24 | (2006.01) | |
| G11C 8/08 | (2006.01) | |
| G11C 29/04 | (2006.01) | |

(52) U.S. Cl.
CPC .......... *G11C 11/4078* (2013.01); *G11C 5/005* (2013.01); *G11C 11/4096* (2013.01); *G11C 29/52* (2013.01); *G11C 7/24* (2013.01); *G11C 8/08* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 11,175,984 B1 * | 11/2021 | Lercari | G06F 11/0784 |
| 11,561,891 B1 * | 1/2023 | Boehm | G06F 12/0246 |
| 2020/0105722 A1 * | 4/2020 | Sethuraman | G11C 5/025 |
| 2022/0197827 A1 * | 6/2022 | Gurumurthi | G11C 7/24 |
| 2023/0205872 A1 * | 6/2023 | Kotra | G06F 21/554 |
| | | | 726/23 |
| 2024/0211344 A1 * | 6/2024 | Bains | G11C 29/028 |

FOREIGN PATENT DOCUMENTS

WO    WO-2022066178 A1 *    3/2022    ............ G06F 11/106

* cited by examiner

*Primary Examiner* — Hoai V Ho
*Assistant Examiner* — Justin Bryce Heisterkamp
(74) *Attorney, Agent, or Firm* — Perkins Coie LLP

(57) ABSTRACT

Methods, apparatuses, and systems related to operations for memory process feedback. A controller can monitor memory activities, such as processes, identify row hammer aggressors, and perform mitigating steps to the row hammer aggressors. The controller may have a table of addresses of row hammer aggressors and perform operations of tracking row hammer aggressors. The controller can determine whether the number of aggressors reaches a threshold. When the number of aggressors reaches the threshold, the controller can send a message with the aggressor addresses to the operating system. The operating system can perform mitigating steps to the row hammer aggressors. In some embodiments, the controller may identify the row hammer aggressors and inject poisoned data into the process to mitigate the row hammer aggressors.

20 Claims, 6 Drawing Sheets

APPARATUS WITH MEMORY PROCESS FEEDBACK

CROSS-REFERENCE TO RELATED APPLICATION(S)

The present application claims priority to U.S. Provisional Patent Application No. 63/293,716, filed Dec. 24, 2021, the disclosure of which is incorporated herein by reference in its entirety.

TECHNICAL FIELD

The disclosed embodiments relate to devices, and, in particular, to semiconductor memory devices with memory process feedback.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. The memory devices can include Double Data Rate (DDR) RAM devices that implement DDR interfacing scheme (e.g., DDR4, DDR5, etc.) for high-speed data transfer.

With technological advancements in various areas and increasing applications, the market is continuously looking for faster, more efficient, and smaller devices. To meet the market demand, the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the semiconductor devices must protect against unauthorized uses or accesses that are also becoming more sophisticated with the technological advancements. Moreover, the need to reduce costs, improve efficiencies and performance, and meet competitive pressures adds an even greater pressure to find answers to these problems.

DETAILED DESCRIPTION

Figure 1A:
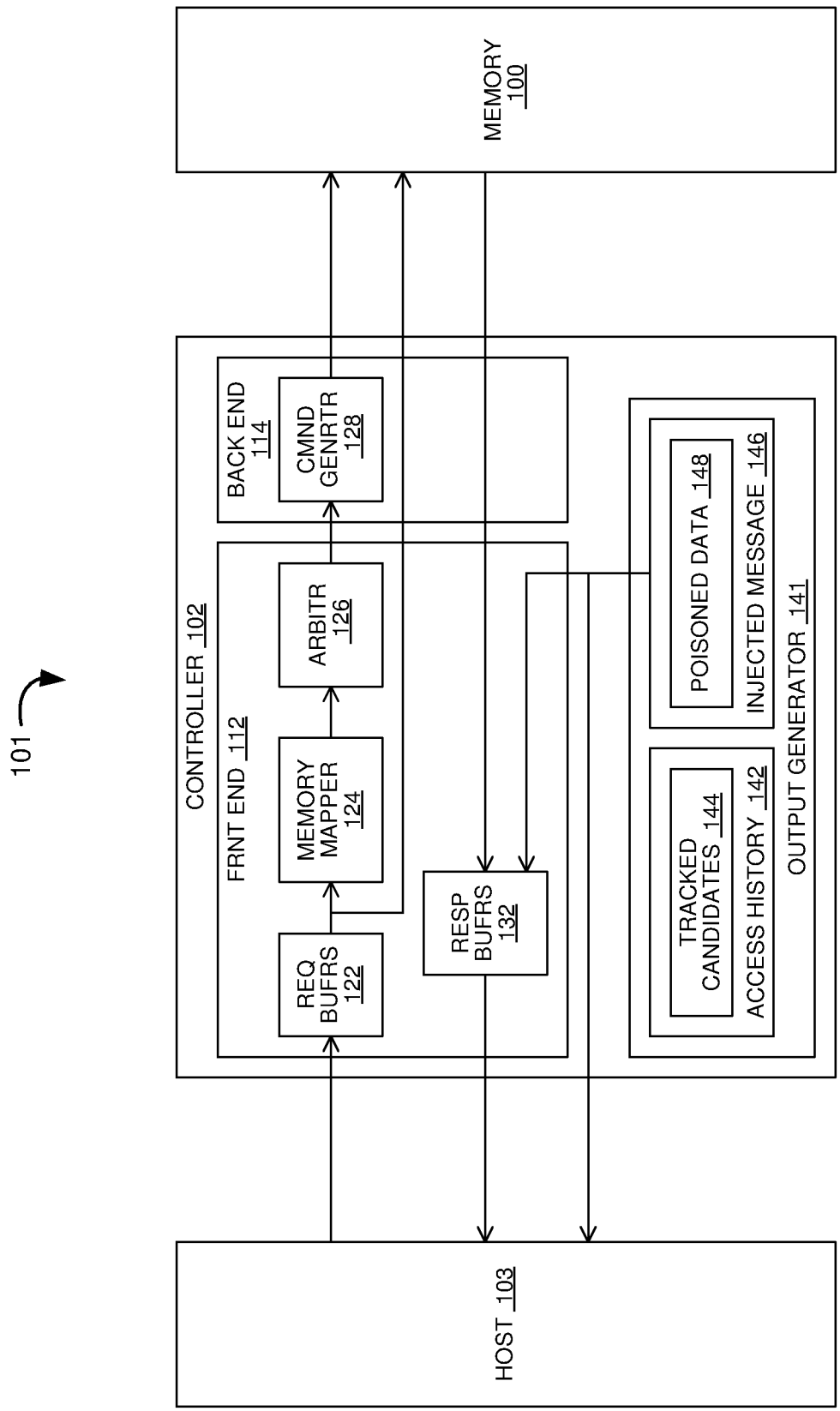
FIG. 1A is a block diagram of an example environment in which an apparatus may operate in accordance with an embodiment of the present technology.

As described in greater detail below, the technology disclosed herein relates to an apparatus, such as memory systems, systems with memory devices, memory controllers, related methods, etc., for managing memory-internal operations, such as memory process feedback. Memory devices can experience data degradation due to the adverse effects of row hammer, in which charge can be lost in the cells of a word line when an adjacent or nearby word line is repeatedly activated/deactivated over a short period of time. For further context, nefarious actors may leverage such data degradation to attack, damage, or disrupt operation of conventional memory devices.

As described in detail below, an apparatus (e.g., a memory system/device, such as a DRAM, a controller, such as a compute express link (CXL) controller, etc.) can monitor memory activity (corresponding to, e.g., one or more processes/threads), identify row hammer aggressors, and perform mitigating steps to the row hammer aggressors. The apparatus may provide information to a host and/or an operating system interfacing with the apparatus to manage and protect against the row hammer effect. The apparatus may further provide information that indicates potential nefarious behavior when the usage pattern matches one or more predetermined conditions, such as when a single or a limited set of processes cause the row hammer effect.

In some embodiments, the apparatus may have a table of addresses, virtual or physical, of row hammer aggressors. The apparatus may be configured to track row hammer aggressors in a row hammer event and determine whether the number of aggressors reaches and/or exceeds a threshold. When the number of aggressors reaches and/or exceeds the threshold, the apparatus can send a message (via, e.g., the CXL communication protocol) with the aggressor addresses to the host and/or the operating system. In response, the operating system can perform mitigating steps to the row hammer aggressors. In some embodiments, the apparatus (e.g., the memory controller) may identify the row hammer aggressors and prevent further damaging activities, such as by injecting poisoned data (e.g., one or more data bits intentionally inverted or flipped, one or more errors injected to the data) into the process to mitigate the row hammer aggressors.

Several embodiments of the present technology are directed to poisoning one or more bits of data (e.g., inverting, flipping, modifying, corrupting, or the like) within a memory device included in a system. Such poisoning of data may facilitate confirming functionality of the on-die ECC circuit and/or providing (outputting) poisoned data for testing the system-level ECC functionality. In this regard, the present technology allows a host device of the system, in conjunction with the memory device coupled therewith, to control which bits to invert (to poison) during write or read operations. In some embodiments, the host device may enable and utilize a type of post-package repair (PPR) function, such as the soft PPR (sPPR) function, of the memory device to remap a logical address of a memory array between different physical addresses at which known-good and known-bad (e.g., poisoned) data are written, to permit the poisoning of data without reliance upon test modes or direct data manipulation.

In some embodiments, poisoning data includes issuing or receiving one or more commands to poison the data. The commands can include one or more commands to enable an sPPR mode of a memory device, one or more commands to execute an sPPR operation, one or more commands to execute a write operation, one or more commands to execute a read operation, and/or one or more commands to disable or undo an sPPR operation. In these and other embodiments, poisoning the data stored to a memory array can include intentionally injecting or causing known errors (e.g., bit inversions, bit deletions, and/or bit insertions) into the memory array (by, e.g., executing one or more sPPR operations and write operations).

As described in detail below, embodiments of the present technology can provide technical advantages over conventional technology and include circuits/functions to 1) enable a controller to send to an operating system information about the address space generating row hammer (RH) aggressors; 2) enable the operating system to correlate the offending process to a physical paging address; 3) enable the operating system to take action on the process operating in the memory space identified by the controller; 4) solve a long-standing data center customer need; 5) provide a solution that is compatible with both controllers and stand-alone DRAMs which have row hammer tracking protocols; 6) complete the loop between the memory hardware and memory software; and 7) cover the protocol, the circuit, and the conversion of a RH signal into a software signal. For example, the controller can include circuitry and/or instructions (e.g., firmware and/or software instructions) to monitor and analyze the tracked table of addresses for conditions indicative of row hammer related conditions. By communicating a corresponding message to the host/operating system, the apparatus can allow the host/operating system to manage the row hammer conditions or potential attacks in addition to the row hammer refreshes conducted by the controller and/or the apparatus. Further, by intentionally injecting poison, the apparatus can additionally stop dangerous operations/processes in addition to the row hammer management.

FIG. 1A is a block diagram of an example environment 101 in which an apparatus (e.g., a memory controller, a memory, or a combination thereof) may operate in accordance with an embodiment of the present technology. The example environment 101 can correspond to a computing device or system that includes a host 103, a memory controller 102, and a memory 100 functionally coupled to each other. The memory 100 can include a memory device or system, such as a volatile memory, a non-volatile memory, or a combination device/system. For example, the memory 100 can include a DRAM. The host 103 can include one or more processors. The host 103 can function according to an operating system and store information to and/or access information stored in the memory 100 via the memory controller 102. For example, the host 103 can send operational communications (e.g., read/write commands, write data, addresses, etc.) to the memory controller 102. The example operating environments can include a computing system having a central processing unit (CPU) as the host 103 interacting with a memory controller to write data to and read data from a DRAM. The apparatus 100 can also send read data (e.g., as a response to a read request) back to the system controller as the operational communications.

The apparatus controller 102 can include a digital circuit configured to manage the flow of the data to or from the apparatus 100 (e.g., the memory for the computing system), such as according to the address and/or the operation. The apparatus controller 102 may include circuits and/or functions (e.g., software and/or firmware instructions) that correspond to a front end 112 and a back end 114. The front end 112 can be configured to provide an interface to the host 103 and/or the rest of the computing system. For example, the front end 112 may buffer requests and responses to/from the host 103. The front end 112 can be independent of the memory type. In comparison, the back end 114 can be configured to provide an interface to the connected/targeted apparatus. For example, the back end 114 can be specifically configured to interface with a targeted memory type.

In some embodiments, the front end 112 can include request buffers 122 configured to buffer requests from the host 103. The buffered requests can be provided to a memory mapper 124 that decodes an address (e.g., a virtual address) associated with the requests to location identifiers (e.g., bank, row, and/or column identifiers) associated with the apparatus 100. The memory mapper 124 can utilize a memory map (e.g., a page table) that tracks the mapping between virtual addresses used by the host 103 and the location identifiers (e.g., the physical addresses) used by the memory 100. The arbiter 126 can be configured to process the addresses decoded by the memory mapper 124 and determine an access sequence for the requests. In other words, the arbiter 126 can rearrange the sequence of the requests to facilitate or improve the corresponding accesses to the storage locations. The arbiter 126 may include self-generated or house-keeping commands, such as refresh commands.

The command generator 128 may receive the sequenced requests and physical addresses at the back end 114. The command generator 128 can generate internal commands according to the sequenced requests. The generated commands (e.g., read commands, write commands, refresh commands, or the like) and the corresponding addresses (physical addresses) can be provided to the memory 100, and the memory 100 can execute the commands. For example, the command generator 128 can generate a write command, which can be communicated to the memory 100 in parallel with a corresponding payload (e.g., the content to be written to the indicated physical address). In response, the memory 100 can store the payload at the specified physical address. Also, the command generator 128 can generate a read command. In response, the memory 100 can access data stored at the specified physical address.

Data from the memory 100 (e.g., read data) can be communicated via an output path to response buffers 132. The response buffers 132 can buffer data from the memory 100 and communicate the buffered data to the host 103.

The controller 102 can include an output generator 141 that analyzes the controller operation and provides information directly to the host 103 under predetermined conditions. The output generator 141 can be implemented at the front end 112, the back end 114, or both and track an access history 142 that describes an amount and/or a frequency of access for all available memory locations or a subset thereof (e.g., a recently accessed set that is based on a predetermined time window or a predetermined quantity of addresses). For example, the output generator 141 can monitor the memory mapper 124, the arbiter 126, and/or the command generator 128 and track the memory access patterns, such as row activation commands and/or read commands.

In some embodiments, the output generator 141 can further identify tracked candidate rows 144 that satisfy a predetermined threshold condition, such as an access count, a timing requirement, or a combination thereof corresponding to a row hammer condition. For example, the output generator 141 can identify the tracked candidate rows 144 as refresh targets, such as rows targeted for row hammer refresh operations. Also, the output generator 141 can identify the tracked candidate rows 144 as row hammer aggressor rows. Additionally or alternatively, the output generator 141 can identify the tracked candidate rows 144 as notable aggressor rows. The notable aggressor rows can represent row hammer aggressors that have persisted beyond a predetermined duration, frequency, or amount of activations or accesses greater than the threshold condition used to initially identify the aggressors.

The output generator 141 can provide an injected message 146 that effectively communicates the access condition of the memory 100 to the host 103. The injected message 146 can be generated at or by the controller 102. For example, the output generator 141 can generate the injected message 146 to communicate the row hammer conditions, such as by including the access history 142 or the tracked candidates 144. In some embodiments, the output generator 141 can send the injected message 146 to the response buffer 130 for communication to the host 103. In other embodiments, the output generator 141 can send the injected message 146 directly to the host 103. The controller 102 may use a CXL message to communicate the injected message 146 to the host 103. Since the output generator 141 tracks the access history 142 and/or the tracked candidates 144 for refresh purposes, the output generator 141 can generate the injected message 146 with minimal additional circuitry or processing.

The host 103 and/or the corresponding operating system can be configured to analyze the injected message 146 for row hammer conditions and/or corresponding nefarious patterns. For example, conventional hosts and operating systems may have access to process behaviors and virtual memory addresses but lacked the capacity to analyze access patterns of physical addresses. In contrast to the conventional systems, the controller 102 can use the injected message 146 and the CXL communication mechanism to effectively provide relevant aspects of the physical address access patterns to the host 103. In turn, the host 103 and/or the operating system can use the received injected message 146 to identify processes that may be violating one or more predetermined conditions, such as by causing the row hammer condition exceeding a predetermined frequency, duration, etc. and/or by causing the row hammer conditions at more than a minimum number of locations. For example, the operating system can halt any processes that cause row hammer conditions at multiple physical addresses (e.g., two or more locations in the memory 100) either concurrently or within a predetermined duration.

In some embodiments, the controller 102 can implement preventative measures to protect against nefarious or damaging activities. For example, the controller 102 can analyze the tracked candidates 144 to detect prolonged or severe row hammer conditions using predetermined thresholds as described above. In response, the controller 102 can generate poisoned data 148 (e.g., a type of injected message 146) that intentionally alters or poisons the data outgoing to the host 103. The poisoned data 148 can correspond to one or more errors intentionally injected into the read data (by, e.g., intentionally inverting or flipping one or more data bits in the read data). The poisoned data 148 can cause errors (e.g., ECC failures or read errors) at the operating system, which in turn can stop the process that is causing the row hammer condition(s). In other embodiments, the memory 100 can generate the poisoned data 148.

Figure 1B:
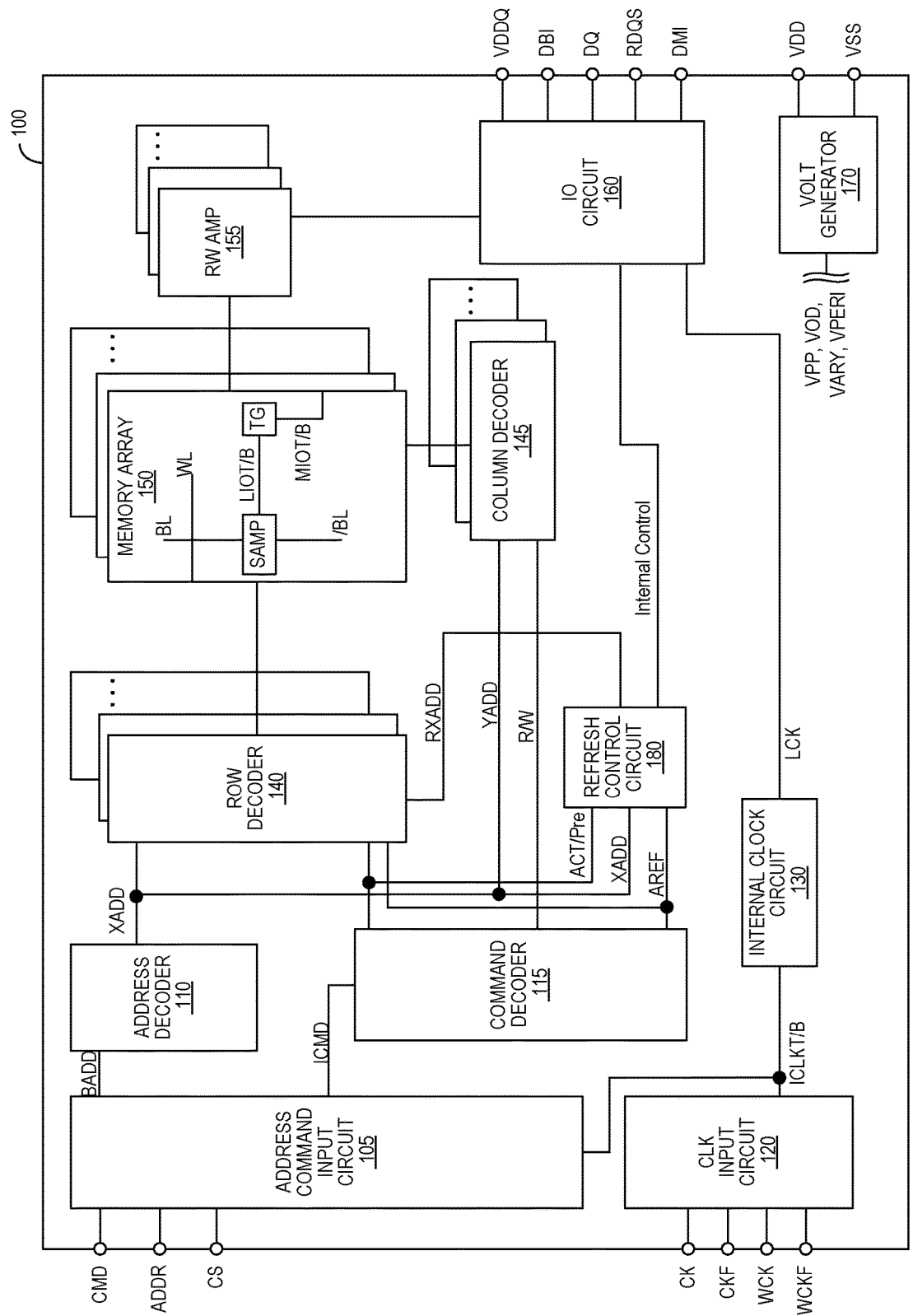
FIG. 1B is a block diagram of an apparatus in accordance with an embodiment of the present technology.

FIG. 1B is a block diagram of the apparatus 100 (e.g., a semiconductor die assembly, including a 3DI device or a die-stacked package) in accordance with an embodiment of the present technology. For example, the apparatus 100 can include a DRAM (e.g., DDR4 DRAM, DDR5 DRAM, LP DRAM, HBM DRAM, etc.), or a portion thereof that includes one or more dies/chips. In some embodiments, the apparatus 100 can include synchronous DRAM (SDRAM) of DDR type integrated on a single semiconductor chip.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1B) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller (e.g., the apparatus controller 102 of FIG. 1A). The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1B). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1B). The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1B) from the command/address input circuit 105. For example, the internal clock circuit 130 can include a clock path (not shown in FIG. 1B) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The apparatus 100 can be connected to any one of a number of electronic devices capable of utilizing memory for the temporary or persistent storage of information, or a component thereof. For example, a host device (e.g., the host 103 of FIG. 1A) of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100, although in other embodiments, the host device may be indirectly connected to memory device (e.g., over a networked connection or through intermediary devices).

The apparatus 100 can include a refresh control circuit 180 configured to control refreshing of the information of the corresponding memory cell MC. For example, as inputs, the refresh control circuit 180 can receive the decoded row address signal (XADD) from the address decoder 110, a refresh signal (AREF) from the command decoder 115, an active signal (ACT) and/or a precharge signal (Pre) from the command decoder 115, etc. The command decoder 115 can generate the active signal (ACT) (e.g., a pulse signal) when the command signals (CMD) indicates row access (e.g., active command). The command decoder 115 can generate the precharge signal (Pre) (e.g., a pulse signal) when the command signal (CMD) indicates precharge. The command decoder 115 can generate the refresh signal (AREF) (e.g., a pulse signal) when the command signal (CMD) indicates an auto-refresh command and/or a self-refresh entry command. In response to the self-refresh entry command, the refresh signal (AREF) can be activated cyclically at a desired interval until a self-refresh exit command is received. In some embodiments, in response to the refresh signal (AREF), the refresh control circuit 180 can generate a refresh row address (RXADD) to the row decoder 140, which initiates the refresh operation therein (e.g., by activating a predetermined word line in the memory cell array). Accordingly, the apparatus 100 can implement a refresh operation (e.g., scheduled refreshes) to refresh (e.g., increase stored charges) targeted locations.

In some embodiments, the refresh control circuit 180 can include a detection circuit configured to control the refresh management operation. The detection circuit can be configured to detect activity based disturb events and control and/or schedule the refresh management operation and refresh word lines that are adjacent to disturbed word lines (e.g., accessed more than a threshold amount of times over a predetermined period since the last refresh operation). For implementing the refresh management, the refresh control circuit 180 can generate one or more addresses that identify victim or aggressor row(s) (e.g., the row(s) adjacent to or within a distance from the heavily activated or aggressor row).

The refresh control circuit 180 (e.g., the detection circuit) can include counters that track row access and logic configured to compare the access count to a predetermined limit. When the access count reaches the limit, the refresh control circuit 180 (e.g., the detection circuit and/or other circuits within the refresh control circuit 180) can identify the corresponding row as the targeted/accessed row and adjacent row(s) as the disturbed row(s). Based on identifying the victim row(s), the refresh control circuit 180 can generate the address(es) of the victim row(s) as the refresh management address.

The refresh control circuit 180 can provide a refresh address (e.g., the refresh management address) to a decoder (e.g., the row decoder 140) for executing the memory-internal operation. The refresh control circuit 180 can also provide internal controls to a scheduling circuit based on detecting the predetermined conditions. The scheduling circuit can be integral with the refresh control circuit 180 and/or included in other circuits, such as the input/output circuit 160. The scheduling circuit can be configured to generate the scheduling outputs based on the internal controls.

The refresh control circuit 180 and/or the scheduling circuit can be configured to determine whether the disturb event associated with the RFM command has been addressed or is scheduled to be addressed within a threshold duration. The circuit can use a time window associated with the RFM command to implement an appropriate disturb mitigation operation, adjust schedules of upcoming internally-initiated disturb mitigation operations, and/or implement an operation different from adjacent row disturb mitigation (e.g., a different memory maintenance operation).

Figure 2:
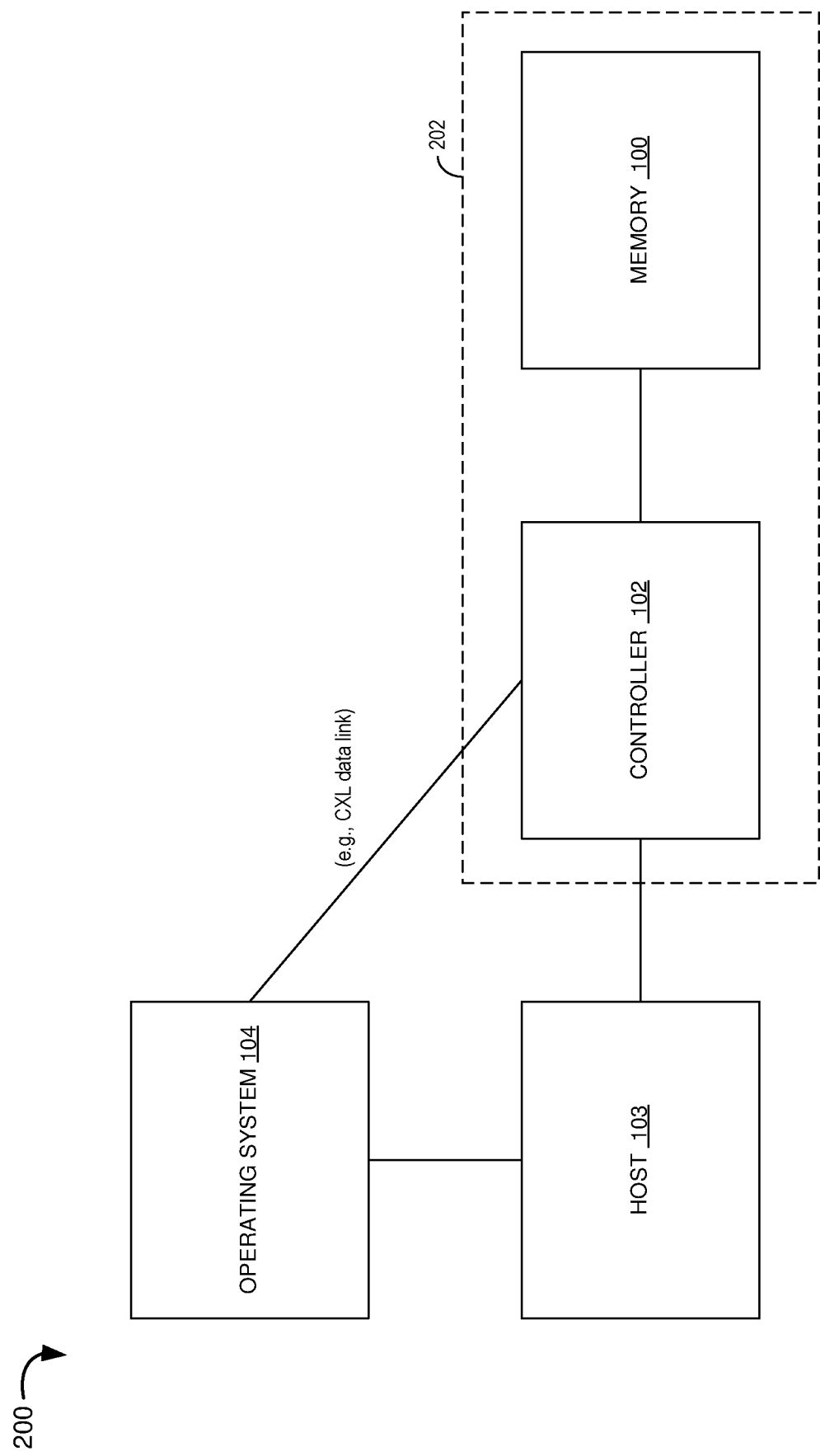
FIG. 2 is a block diagram of an example environment in which an apparatus may operate in accordance with an embodiment of the present technology.

FIG. 2 is a block diagram of an example environment 200 in which an apparatus 202 (e.g., a CXL card 202, the memory 100, the controller 102, or a combination thereof) may operate in accordance with an embodiment of the present technology. The example environment 200 can correspond to a computing device or system. The memory 100 can include a volatile memory, a non-volatile memory, or a combination device/system. For example, the memory 100 can include a DRAM.

The memory 100 can be electrically coupled to the controller 102 (e.g., a memory controller, such as a CXL controller, a buffer, a repeater device, such as an RCD, etc.), the host 103 (e.g., a set of processors), and an operating system 104. Some example operating environments can include a computing system having a central processing unit (CPU) as the host 103 interacting with a memory controller to write data to and read data from a DRAM. The host 103 can function according to the operating system 104 and send operational communications (e.g., read/write commands, write data, addresses, etc.) to the memory controller. The apparatus 100 can also send read data back to the system controller 104 as the operational communications. The apparatus controller 102 can manage the flow of the data to or from the apparatus 100 according to the address and/or the operation. The apparatus 100 and controller 102 can be electrically coupled together to form the CXL card 202. The controller 102 can track the data entering the CXL card 202 and initiate mitigating steps.

The controller 102 can have and maintain a table of addresses (virtual or physical) of potential row hammer aggressors and inform the CPU or operating system 104 of an address of an aggressor operating maliciously. In some embodiments, the controller 102 monitors the activity of aggressors that correspond to a process. For example, the data of the process can be read by the controller 102 either on a side band bus or the main data bus. The controller 102 can track the number of aggressors for each memory sub space. When the number of aggressors reaches and/or exceeds an aggressor threshold (e.g., based on a number of activities), the controller 102 can send a message (e.g., an interrupt and/or the injected message 146 of FIG. 1) to the operating system 104. The message can include the physical DRAM addresses and/or the corresponding virtual addresses of the aggressors. In some implementations, the controller 102 uses a light pen clock (LPCK) input to trigger a row address strobe (RAS) signal to put the DRAM channels in lockstep. Putting the DRAM channels in lockstep, can allow the controller 102 to have a RH solution for the row hammer aggressors, in addition to or instead of every DRAM having a sampling circuit (e.g., the refresh control circuit 180 of FIG. 1B). The DRAM can continue to have the RH allocation and the victim determination circuits, while the controller identifies aggressor addresses in the aggressor table.

The operating system 104 can poll the data structure through a sideband bus or the main data bus. The operating system 104 can access an error log and retrieve the DRAM address and determine whether the aggressor addresses map to a certain process to decide if the behavior is malicious. In some implementations, the operating system 104 can correct the data or end the process.

In some embodiments, such as when there is data which cannot be corrected and/or can prove fatal to the system, the controller 102 can feed the poisoned data 148 of FIG. 1A back to host 103 and inject it into the process causing the row hammer condition. When the host 103 receives the poisoned data, the process/thread can be paused or terminated as the received information is no longer reliable, thus mitigating the aggressor. The controller 102 can inject the poisoned data 148 whenever there is a read operation by the memory 100 because the read operation carries the poisoned data from the controller 102 to the host 103. In some embodiments, when the number of aggressors reaches and/ or exceeds an aggressor threshold, the controller 102 injects the poisoned data. By injecting poisoned data to protect the overall integrity of the operation, the controller 102 can preserve time for the apparatus 100 to implement an RH. By the eliminating the requests for the DRAM, the controller 102 can provide the DRAM with time to perform a mitigating action (e.g., refresh operations).

In some embodiments, the computing system (via, e.g., the memory 100, the controller 102, the host 103, or the operating system of FIG. 1A) can partition the DRAM into a certain number of spaces (e.g., 16 or 32 pieces) for data collection or accounting purposes. Based on the aggressor addresses, the system can have a count for each of the aggressors. For example, if an aggressor's address in row 42 falls into bin 9, the next time row 42 shows up, the system can increment bin 9 by 1. In another example, if bin 11 and bin 12 continuously have aggressive activity, the data center applications can track the activity and message the operating system 104 or the controller 102 of the aggressive activity. In data center applications, the computing system can allocate memory address ranges (e.g., fixed memory sizes) to multiple users facilitated by the same module. Hence, any potentially nefarious activities can be isolated to or identified by individual processes that are accessing or operating within the allocated memory address range. The computing system can use the injected message 146 from the controller 102 to identify the potentially nefarious activities using mostly existing processes and circuits.

Figure 3:
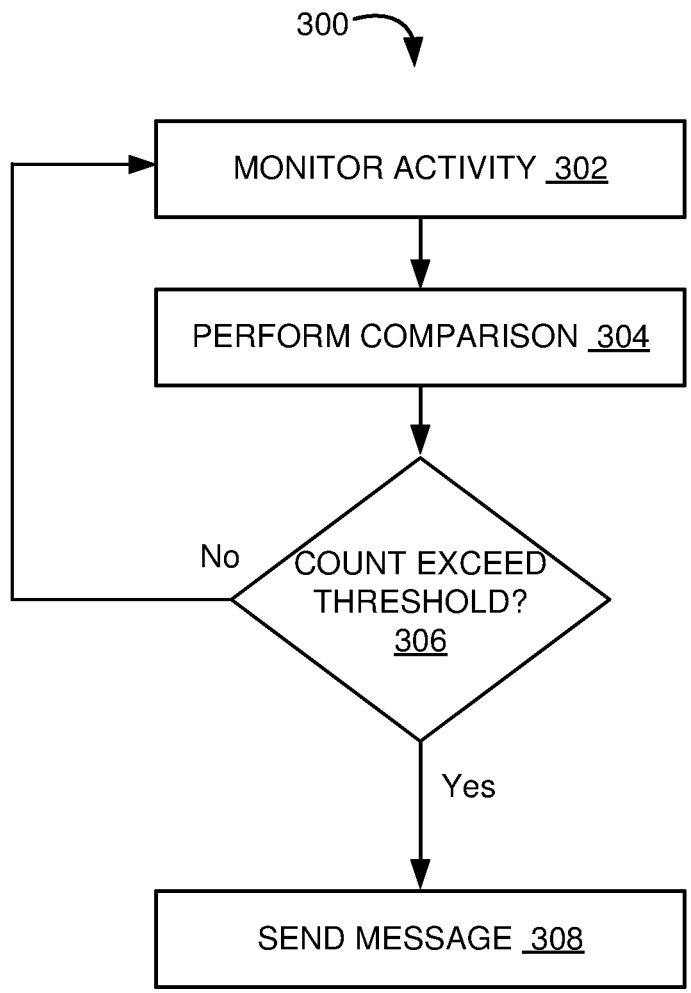
FIG. 3 is a flow diagram illustrating an example method of operating an apparatus in accordance with an embodiment of the present technology.

FIG. 3 is a flow diagram illustrating an example method 300 of operating an apparatus (e.g., the system 101 of FIG. 1A, the apparatus 100 of FIG. 1A, the refresh control circuit 180 of FIG. 1B, and/or the system of FIG. 2) in accordance with an embodiment of the present technology. The method 300 be for providing memory process feedback.

At block 302, a controller (e.g., the controller 102 of FIG. 1A or 2) can monitor the activity of a process to identify potential row hammer aggressors. The controller can have and maintain a table of addresses (virtual or physical) and corresponding access statuses/histories (e.g., the access history 142 of FIG. 1A) for identifying potential row hammer aggressors.

At block 304, the controller can compare the access information to predetermined thresholds indicative of row hammer conditions. At decision block 306, the controller can determine whether the access information (e.g., access counts for the addresses) exceeds an aggressor threshold. Accordingly, the controller can determine the tracked candidates 144 of FIG. 1A. In some embodiments, the threshold can vary based on the number of rows involved in the activity. For example, if the controller identifies 2 row hammer aggressors, the controller is less aggressive to initiate mitigating steps (e.g., alerting the operating system or injecting poisoned data) compared to when the controller identifies 1000 row hammer aggressors. The controller can initiate different mitigating steps based on the number of rows containing row hammer aggressors. For example, if 100 rows are identified with row hammer aggressors, the controller can initiate a first type of mitigating steps (e.g., monitor the rows more aggressively), if 500 rows are identified with row hammer aggressors, the controller can initiate a second type of mitigating steps (e.g., messaging the operating system), or if 1000 rows are identified with row hammer aggressors, the controller initiates a third type of mitigating steps (e.g., injecting poisoned data). In some embodiments, the threshold is based on a time window of the RH. For example, in the time windows of 0-64 milliseconds, 64-128 milliseconds, and 128-192 milliseconds, the controller can track row hammer aggressors and at each refreshed window. If an aggressor or number of aggressors are identified in each window, then the controller can adjust (e.g., lower) the threshold required to trigger mitigating steps to eliminate the repeat aggressors.

When the number of aggressors reaches and/or exceeds an aggressor threshold, at block 308, the controller can send a message (e.g., the injected message 146 of FIG. 1A and/or the tracked candidates 144) to the operating system (e.g., operating system 104 of FIG. 2) through the host (e.g., the host 103 of FIG. 1A or 2) or directly to the operating system. The message can include the physical DRAM addresses of the aggressors. The controller can transmit the message to the host according to a compute express link protocol for providing the host with metrics that correspond to physical addresses of the memory. The controller can transmit the message to the host as a trigger. The host can respond to the trigger by gathering a copy of the aggressor table, identifying the thread associated with the addresses indicated in the aggressor table, and pausing or terminating the identified process.

Figure 4:
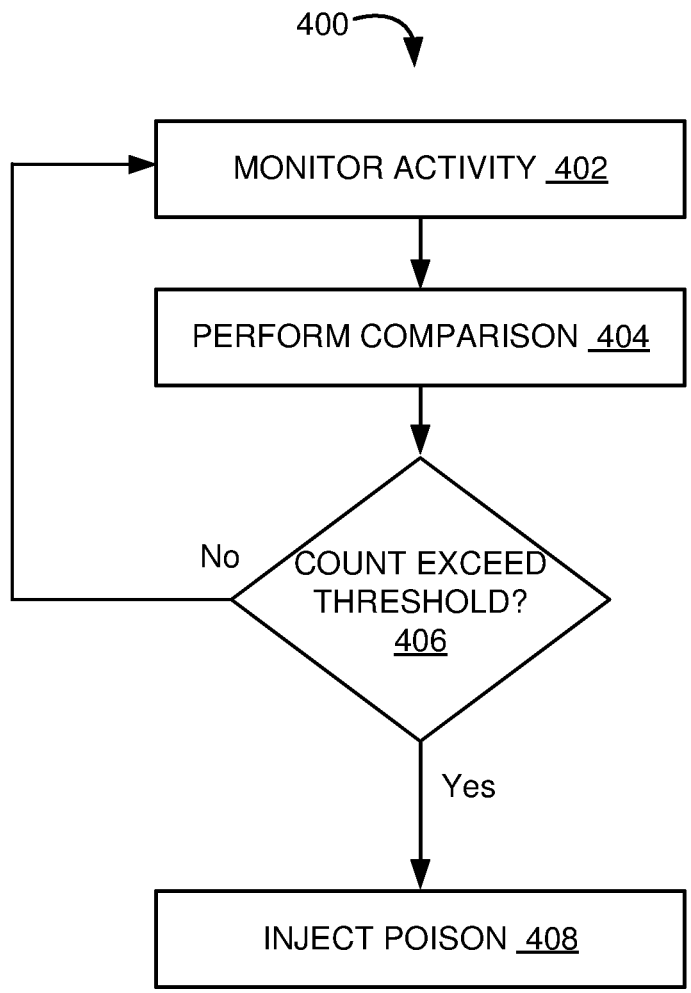
FIG. 4 is a flow diagram illustrating an example method of operating an apparatus in accordance with an embodiment of the present technology.

FIG. 4 is a flow diagram illustrating an example method 400 of operating an apparatus (e.g., the system 101 of FIG. 1A, the apparatus 100 of FIG. 1A, the refresh control circuit 180 of FIG. 1B, and/or the system of FIG. 2) in accordance with an embodiment of the present technology. The method 400 be for providing memory process feedback.

At block 402, a controller (e.g., the controller 102 of FIG. 1A or 2) can monitor the activity of a process to identify potential row hammer aggressors. The controller can have and maintain a table of addresses (virtual or physical) and corresponding access statuses/histories (e.g., the access history 142 of FIG. 1A) for identifying potential row hammer aggressors.

At block 404, the controller can compare the access information to predetermined thresholds indicative of row hammer conditions. At decision block 406, the controller can determine whether the access information (e.g., access counts for the addresses) exceeds an aggressor threshold. Accordingly, the controller can determine the tracked candidates 144 of FIG. 1A. In some implementations, the threshold can be similar to or greater than the threshold at decision block 306 of FIG. 3.

When the number of aggressors reaches and/or exceeds an aggressor threshold, at block 408, the controller can inject poisoned data (e.g., the poisoned data 148 of FIG. 1A) into the process (via, e.g., read data) to end the process. The controller can inject the poisoned data whenever there is a read operation, thus allowing the read data to carry the poisoned data from the controller to the operating system.

Figure 5:
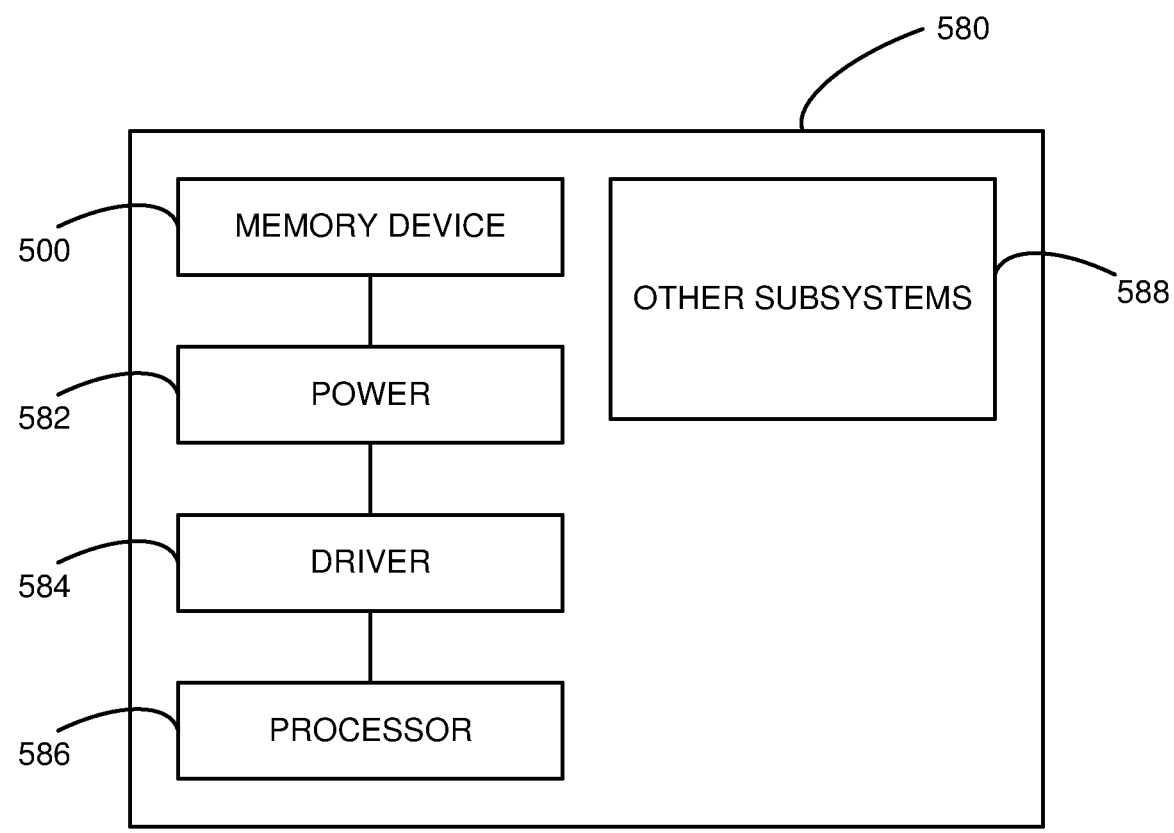
FIG. 5 is a schematic view of a system that includes an apparatus in accordance with an embodiment of the present technology.

FIG. 5 is a schematic view of a system that includes an apparatus in accordance with embodiments of the present technology. Any one of the foregoing apparatuses (e.g., memory devices) described above with reference to FIGS. 1A-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588. The memory device 500 can include features generally similar to those of the apparatus described above with reference to FIGS. 1A-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-5.

I claim:

1. An apparatus, comprising:
   a memory;
   a controller coupled to the memory, the controller configured to:
      monitor activity of at least one memory address in the memory;
      identify the at least one memory address as a row hammer aggressor address when accesses thereto satisfy a predetermined condition;
      inject at least one error into the identified at least one memory address; and
      transmit a message to a host, wherein the message includes the identified at least one memory address in a process operating in the memory.

2. The apparatus of claim 1, wherein the controller is further configured to:
   intentionally inject the at least one error into data read from the identified at least one memory address,
      wherein the at least one error comprises a bit insertion, a bit deletion, or a bit inversion.

3. The apparatus of claim 2, wherein injecting the at least one error is performed at the controller in response to a read operation for the identified at least one memory address.

4. The apparatus of claim 1, wherein the message is a first message and wherein the controller is further configured to:
   identify a number of memory addresses as row hammer aggressors;
   determine that the number of memory addresses satisfies a count threshold; and
   transmit a second message to an operating system, wherein the second message includes the number of memory addresses.

5. The apparatus of claim 1, wherein the controller is further configured to:
   identify a number of memory addresses as row hammer aggressors;
   determine that the number of memory addresses reaches a count threshold; and
   inject the at least one error into data read from at least one of the identified memory addresses.

6. The apparatus of claim 1, wherein the controller is further configured to:
   transmit the message directly in response to identifying the at least one memory address as the row hammer aggressor address.

7. The apparatus of claim 1, wherein the memory is a dynamic random-access memory (DRAM) and the controller is a compute express link (CXL) controller.

8. A system, comprising:
   a host configured to implement an operating system;
   a memory operably coupled to at least one processor and configured to store data and provide access thereto;
   a controller coupled to the memory, the controller configured to:
      monitor access to at least one memory address in the memory;
      identify the at least one memory address as a row hammer aggressor address when accesses thereto satisfy a predetermined condition;
      inject at least one error into the identified at least one memory address; and
      transmit a message to the host, wherein the message includes the identified at least one memory address;
   wherein
   the host is configured, via the operating system, to control a process associated with the identified at least one memory address to manage a corresponding row hammer condition at the memory.

9. The system of claim 8, wherein the controller is further configured to:
   transmit the message to the host according to a compute express link protocol for providing the host with metrics that correspond to physical addresses of the memory.

10. The system of claim 8, wherein:
    the controller is further configured to
       maintain an aggressor table that tracks access details for a plurality of memory addresses;

transmit the message to the host as a trigger; and
the host is further configured to
respond to the trigger by gathering a copy of the aggressor table,
identify the process associated with the addresses indicated in the aggressor table, and
pause or terminate the identified process.

11. The system of claim 8,
wherein the at least one error comprises a bit insertion, a bit deletion, or a bit inversion.

12. The system of claim 8, wherein the message is a first message and wherein the controller is further configured to:
identify a number of memory addresses as row hammer aggressors in an aggressor table;
determine the number of memory addresses reaches a count threshold; and
transmit a second message to the operating system, wherein the second message includes the identified memory addresses.

13. The system of claim 8, wherein:
the memory is partitioned into a number of user spaces; and
the host, via the operating system, is configured to
identify a user space associated with the identified at least one memory address, and
adjust one or more processes operating within the user space.

14. The system of claim 8, wherein:
the memory is a dynamic random-access memory (DRAM);
the controller is a compute express link (CXL) controller; and
the host includes at least one processor communicatively coupled to the controller according to a CXL connection.

15. A method of operating an apparatus, the method comprising:
monitoring activity of at least one memory address in a memory;
identifying the at least one memory address as a row hammer aggressor address when accesses thereto satisfy a predetermined condition;
injecting at least one error into the identified at least one memory address; and
transmitting a message to a host, wherein the message includes the identified at least one memory address in a process operating in the memory.

16. The method of claim 15, further comprising:
intentionally injecting the at least one error into data read from the identified at least one memory address,
wherein the at least one error comprises a bit insertion, a bit deletion, or a bit inversion.

17. The method of claim 16, wherein injecting the at least one error is performed at a controller in response to a read operation for the identified at least one memory address.

18. The method of claim 15, wherein the message is a first message and the method further comprising:
identifying a number of memory addresses as row hammer aggressors;
determining that the number of memory addresses satisfies a count threshold; and
transmitting a second message to an operating system, wherein the second message includes the number of memory addresses.

19. The method of claim 15, further comprising:
identifying a number of memory addresses as row hammer aggressors;
determining that the number of memory addresses reaches a count threshold; and
injecting the at least one error into data read from at least one of the identified memory addresses.

20. The method of claim 15, further comprising:
transmitting the message directly in response to identifying the at least one memory address as the row hammer aggressor address.

* * * * *